United States Patent
Chen et al.

(10) Patent No.: US 9,693,628 B2
(45) Date of Patent: Jul. 4, 2017

(54) MOUNTING DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 76 days.

(21) Appl. No.: 14/813,128

(22) Filed: Jul. 30, 2015

(65) Prior Publication Data
US 2016/0296016 A1    Oct. 13, 2016

(30) Foreign Application Priority Data
Apr. 13, 2015  (TW) .............................. 104111884 A (51) Int. Cl.
*A47B 88/04* (2006.01)
*A47B 88/08* (2006.01)
(Continued)

(52) U.S. Cl.
CPC .............. *A47B 88/08* (2013.01); *A47B 88/40* (2017.01); *A47B 88/423* (2017.01); *A47B 88/49* (2017.01);
(Continued)

(58) Field of Classification Search
CPC ..... A47B 88/04; A47B 88/0418; A47B 88/08; A47B 88/10; A47B 88/00; A47B 88/40;
(Continued)

(56) References Cited

U.S. PATENT DOCUMENTS 8,562,085 B2 * 10/2013 Chen ..................... A47B 88/10
312/333
2009/0294621 A1 * 12/2009 Yu ....................... A47B 88/044
248/429

(Continued)

FOREIGN PATENT DOCUMENTS

EP    2 517 604 A1   10/2012
EP    2 550 899 A1   1/2013

*Primary Examiner* — Tan Le
(74) *Attorney, Agent, or Firm* — Winston Hsu (57) ABSTRACT

A mounting device is configured to mount a carried object to a connecting board. The connecting board is arranged with a mounting hole for mounting a positioning member of the carried object. The mounting device includes a blocking portion, an operating portion, and a base portion. The blocking portion is adjacent to the mounting hole of the connecting board. The operating portion is operatively connected to the blocking portion. The base portion has a first section connected to the connecting board, and a second section connected to the blocking portion. Wherein, when the positioning member of the carried object enters the mounting hole of the connecting board, the blocking portion is configured to block the positioning member; and when the operating portion is operated to move the blocking portion away from the mounting hole of the connecting board, the positioning member is able to disengage from the mounting hole.

5 Claims, 8 Drawing Sheets (51) Int. Cl.
*A47B 88/40* (2017.01)
*A47B 88/423* (2017.01)
*H05K 7/14* (2006.01)
*A47B 88/49* (2017.01)

(52) U.S. Cl.
CPC .... *H05K 7/1489* (2013.01); *A47B 2210/0081* (2013.01)

(58) Field of Classification Search
CPC ................ A47B 88/49; A47B 88/423; A47B 2210/0081
USPC .............. 238/27.3, 221.11, 222.11; 312/333, 312/334.46
See application file for complete search history.

(56) References Cited

U.S. PATENT DOCUMENTS

| | | | |
|---|---|---|---|
| 2011/0017894 A1* | 1/2011 | Yu ........................ | H05K 7/1489 248/309.1 |
| 2011/0024592 A1* | 2/2011 | Yu ........................ | H05K 7/1418 248/309.1 |
| 2012/0063709 A1 | 3/2012 | Chen | |
| 2016/0186895 A1* | 6/2016 | Chen ........................ | F16L 3/015 248/68.1 |

* cited by examiner

MOUNTING DEVICE

BACKGROUND OF THE INVENTION

1. Field of the Invention

The present invention relates to a mounting device, and more particularly, to a mounting device capable of rapidly mounting a carried object to a target without tools.

2. Description of the Prior Art

Generally, a slide rail assembly comprises at least two rails. The rails are capable of longitudinally moving relative to each other to allow the slide rail assembly to extend or retract. Wherein, one of the rails is usually configured to be installed with a carried object, so that the carried object can be moved from a retracted position to an extended position through relative movement of the two rails. For example, U.S. Pat. No. 8,562,085 B2 discloses an installation device for slide assembly. Wherein, an exterior equipment (38) is engaged to an installation hole (20a) of a rail (12) of the slide assembly through an installation member (40a), and a retaining hole (32) of a retaining member (22) accommodates the installation member (40a), so that the installation member (40a) of the exterior equipment (38) is located in the installation hole (20a) and cannot disengage from the rail (12). The case is provided for reference.

SUMMARY OF THE INVENTION

The present invention relates to a mounting device capable of mounting a carried object to a target (such as a slide rail or a connecting board).

According to an embodiment of the present invention, a mounting device is configured to mount a carried object to a connecting board. The carried object comprises a positioning member. The connecting board is arranged with a mounting hole for mounting the positioning member. The mounting device comprises a blocking portion, an operating portion, and a base portion. The blocking portion is adjacent to the mounting hole of the connecting board. The operating portion is operatively connected to the blocking portion. The base portion has a first section and a second section corresponding to the first section. The first section is connected to the connecting board, and the second section is connected to the blocking portion. Wherein, when the positioning member of the carried object enters the mounting hole of the connecting board, the blocking portion is configured to block the positioning member; and when the operating portion is operated to move the blocking portion away from the mounting hole of the connecting board, the positioning member is able to disengage from the mounting hole of the connecting board.

According to another embodiment of the present invention, a mounting device is applicable to a slide rail assembly. The slide rail assembly is configured to mount a carried object to a rack. The slide rail assembly comprises a first rail and a second rail longitudinally movable relative to the first rail. The second rail is arranged with a mounting hole for mounting a positioning member of the carried object. The mounting device comprises a base portion, a blocking portion, and an operating portion. The base portion has a first section and a second section. The first section is connected to the second rail. The blocking portion is connected to the second section of the base portion and is adjacent to the mounting hole of the second rail. The blocking portion is configured to block the positioning member after the positioning member of the carried object enters into the mounting hole of the second rail. The operating portion is operatively connected to the blocking portion to control the blocking portion to move, wherein when the operating portion is operated to move the blocking portion away from the mounting hole of the second rail, the positioning member is able to disengage from the mounting hole of the second rail.

According to another embodiment of the present invention, a mounting device comprises a base portion, a blocking portion, and an operating portion. The base portion has a first section and a second section. The blocking portion is connected to the second section of the base portion. The operating portion is operatively connected to the blocking portion, and is configured to move the blocking portion relative to the first section of the base portion.

According to one of the above embodiments of the present invention, the mounting device further comprises an opening adjacent to the blocking portion. The opening corresponds to the mounting hole of the connecting board, wherein when the positioning member of the carried object is mounted to the mounting hole of the connecting board, the positioning member enters the opening and is blocked by the blocking portion.

According to one of the above embodiments of the present invention, the base portion is arranged between the operating portion and the blocking portion, and the operating portion is tilted relative to the base portion.

According to one of the above embodiments of the present invention, the mounting device further comprises at least one guiding portion adjacent to the blocking portion, wherein the positioning member of the carried object is guided into the opening through the at least one guiding portion, and is blocked by the blocking portion.

According to one of the above embodiments of the present invention, the mounting device further comprises an extending portion located away from the operating portion, wherein the connecting board further comprises an auxiliary portion abutting against the extending portion.

According to one of the above embodiments of the present invention, at least one rib is arranged between the operating portion and the blocking portion.

According to one of the above embodiments of the present invention, the connecting board further comprises a side wall and an extending wall substantially bent from the side wall. The mounting hole of the connecting board comprises a first portion and a second portion. The first portion is arranged on the extending wall, and the second portion is arranged on the side wall and communicating with the first portion.

According to one of the above embodiments of the present invention, the operating portion is tilted relative to the first section of the base portion. The mounting device further comprises an opening and a guiding portion. The blocking portion is arranged between the opening and the guiding portion.

One of the characteristics of the present invention is that the carried object can be rapidly mounted to the target without tools through blocking the positioning member of the carried object by the blocking portion of the mounting device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
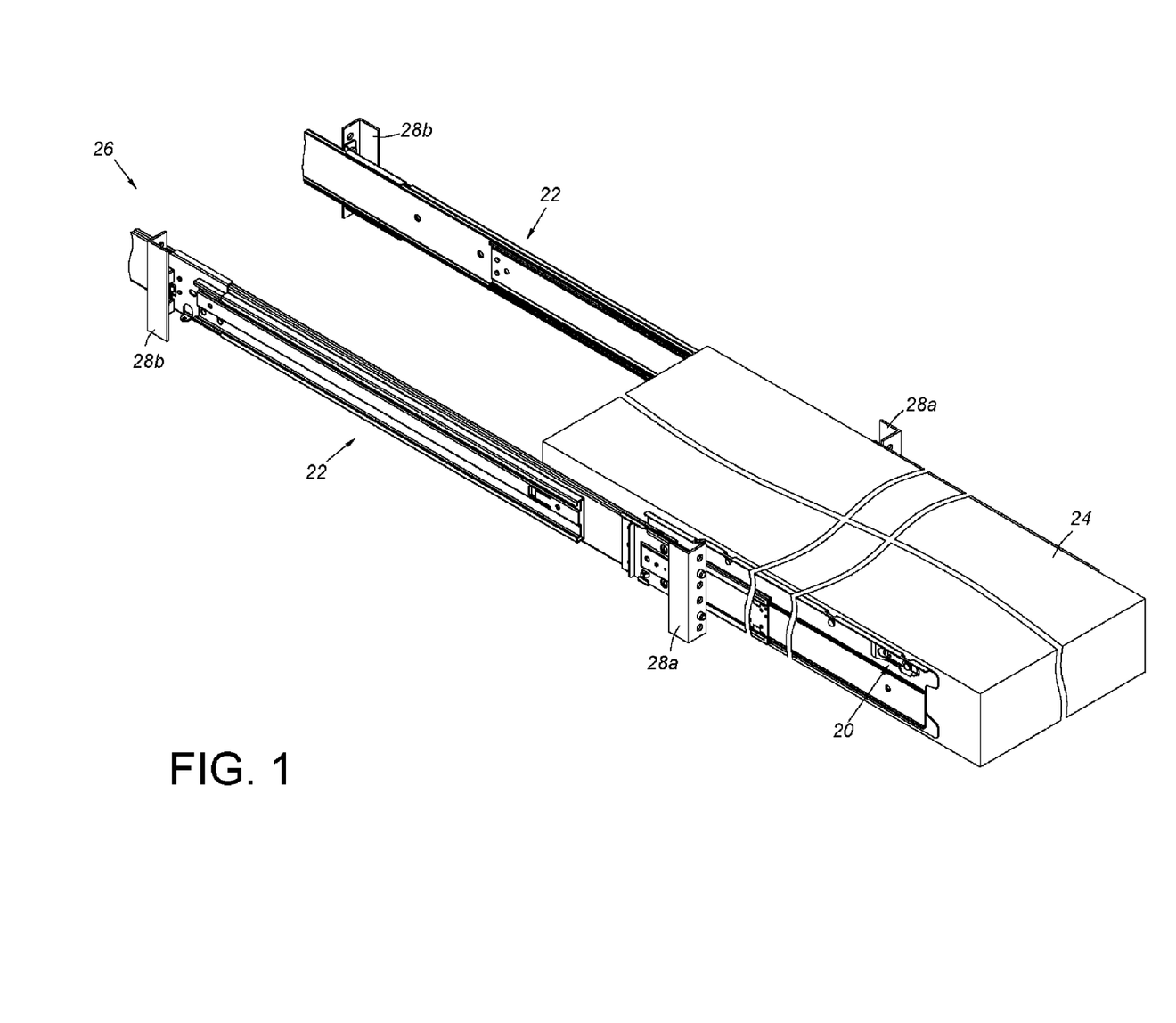
FIG. 1 is a diagram showing a mounting device applicable to a slide rail assembly, and a carried object mounted to a rack through the slide rail assembly according to an embodiment of the present invention.

FIG. 1 shows a mounting device 20 applicable to a slide rail assembly 22 according to an embodiment of the present invention. The slide rail assembly 22 is configured to mount a carried object 24 to a rack 26. The carried object 24 can be mounted to two pairs of posts 28a and 28b of the rack 26 through a pair of the slide rail assemblies 22.

Figure 2:
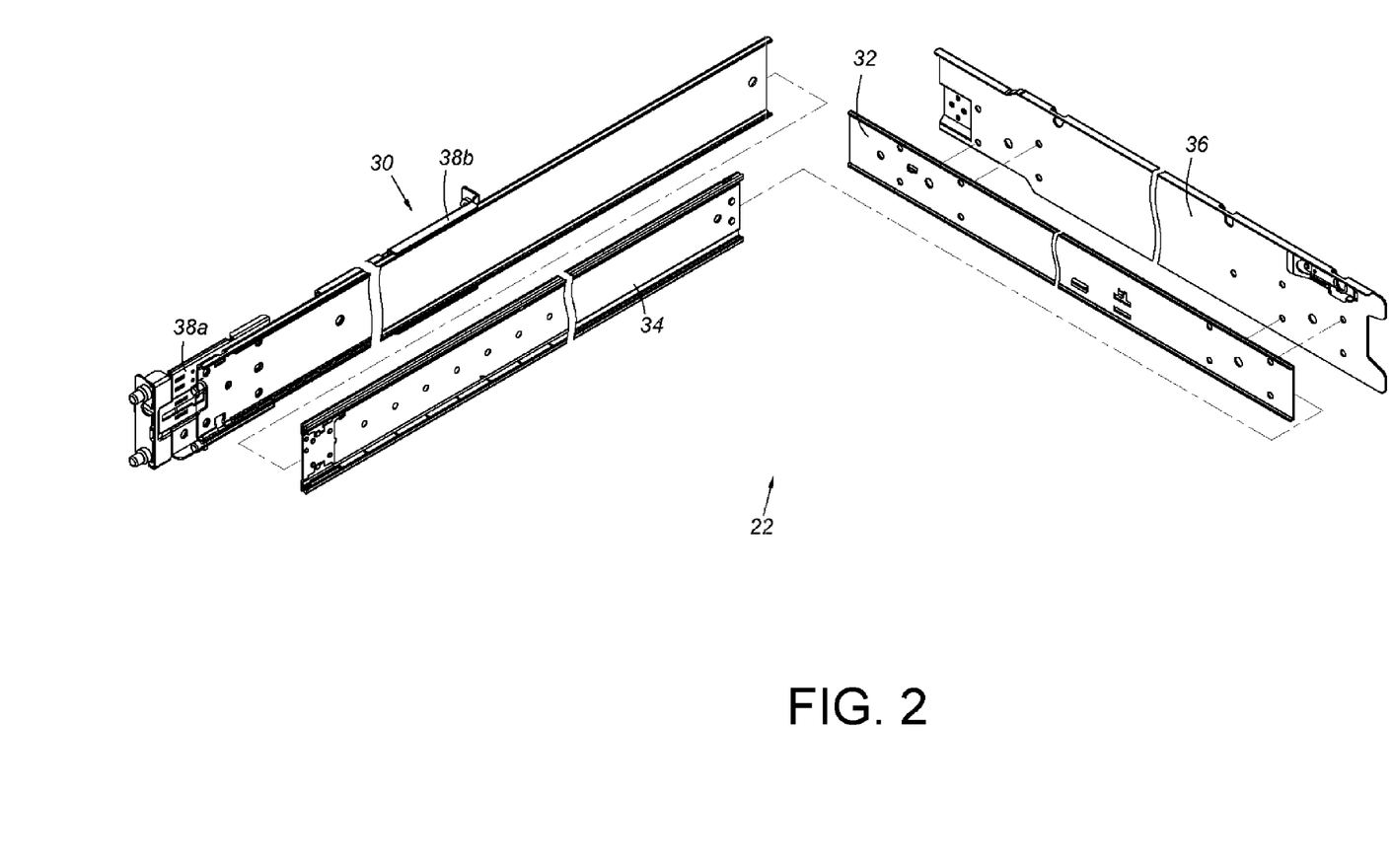
FIG. 2 is an exploded view of the slide rail assembly in FIG. 1.

As shown in FIG. 1 and FIG. 2, the slide rail assembly 22 comprises a first rail 30 and a second rail 32. In the present embodiment, the slide rail assembly 22 further comprises a third rail 34 and a connecting board 36. Two portions of the first rail 30 are capable of being mounted to a pair of posts 28a and 28b of the rack 26 through two brackets 38a and 38b respectively. The third rail 34 is movably connected to the first rail 30 along a longitudinal direction, and the third rail 34 is configured to elongate a moving distance of the second rail 32 relative to the first rail 30. On the other hand, the second rail 32 is movably connected to the third rail 34 along the longitudinal direction. The connecting board 36 is attached to the second rail 32 to be considered as a whole. For example, the connecting board 36 and the second rail 32 can be formed in one piece directly, or can be mutually connected through connection means, such as screwing, latching, riveting, buckling, or soldering, but the present invention is not limited thereto. The connecting board 36 is movably connected to the third rail 34 through the second rail 32, and is longitudinally movable relative to the first rail 30.

Figure 3:
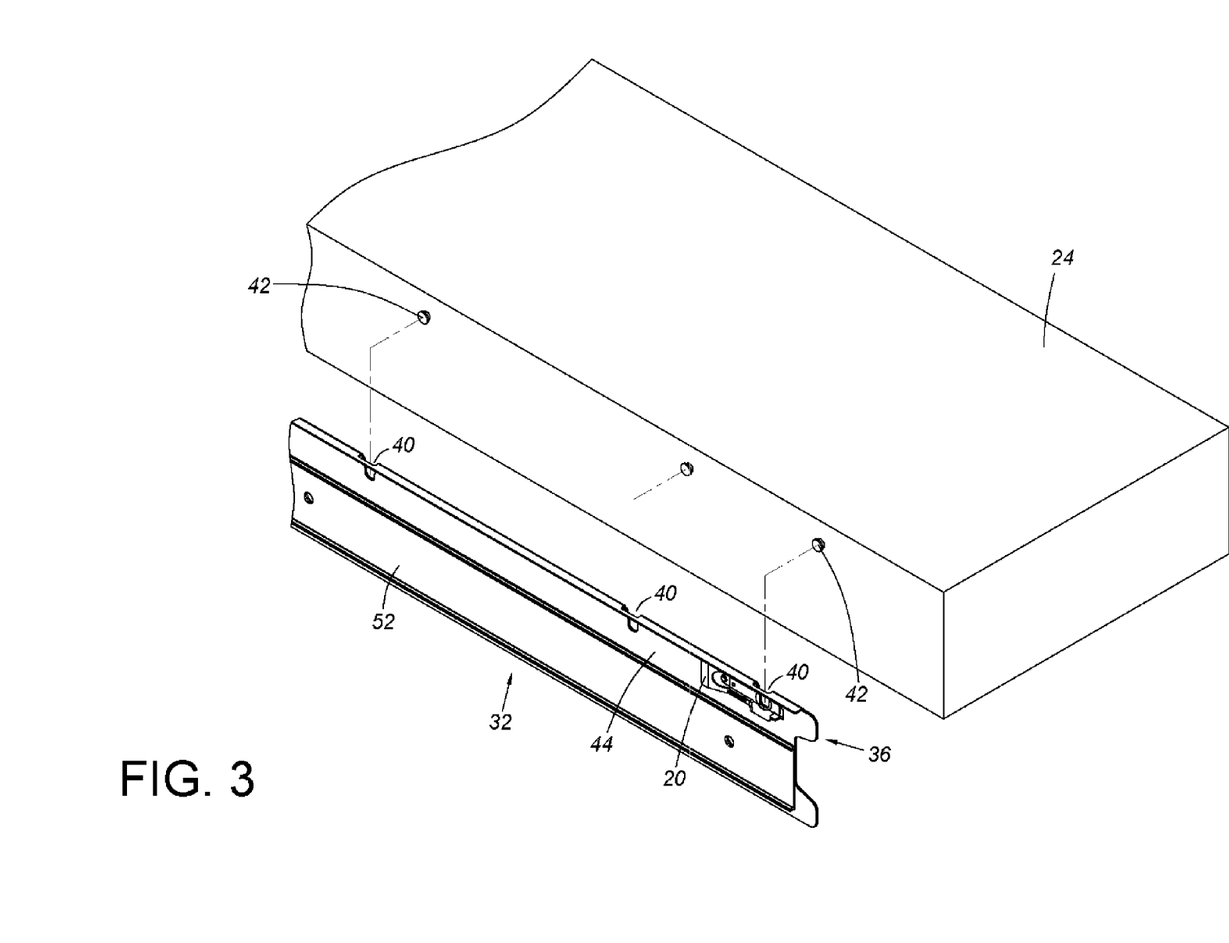
FIG. 3 is a diagram showing the carried object mounted and attached to a connecting board of a rail, and the mounting device attached to the connecting board and adjacent to a mounting hole of the connecting board according to an embodiment of the present invention.

As shown in FIG. 3, the connecting board 36 is arranged with at least one mounting hole, and there are three mounting holes 40 in the present embodiment. On the other hand, the carried object 24 can comprise a plurality of positioning members 42 corresponding to the mounting holes 40. The mounting holes 40 are configured to mount the positioning members 42 of the carried object 24 correspondingly, so as to further mount the carried object 24 to the connecting board 36. Particularly, quantities of the mounting hole and the positioning member can be different from the above embodiment according to requirements, and the present invention is not limited thereto.

Figures 4, 5:
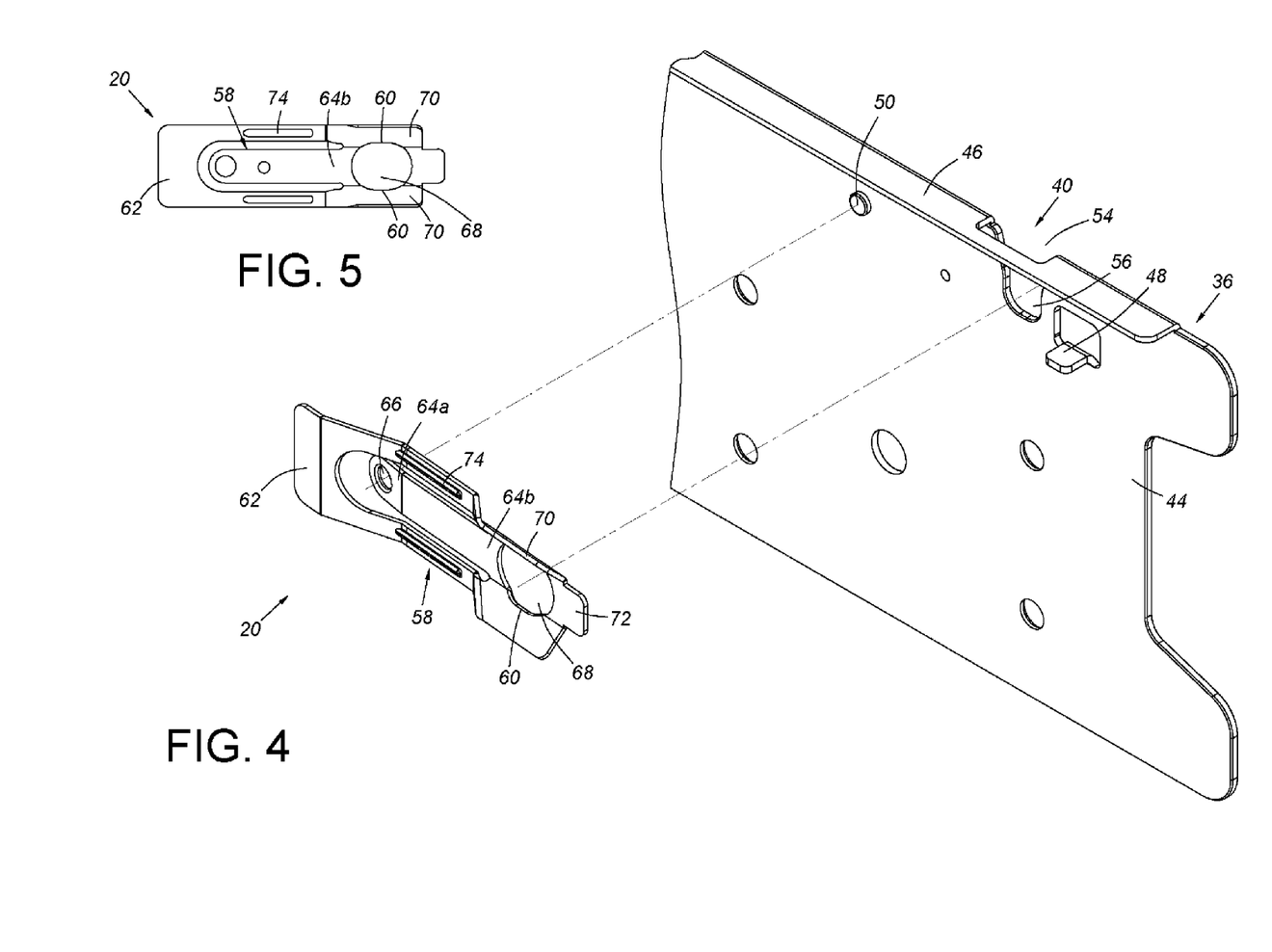
FIG. 4 is an exploded view of the mounting device and the connecting board according to an embodiment of the present invention.
FIG. 5 is a top view of the mounting device according to an embodiment of the present invention.

As shown in FIG. 3 and FIG. 4, the mounting device 20 is configured to mount and attach the carried object 24 to the connecting board 36 on the second rail 32. In the present embodiment, the connecting board 36 further comprises a side wall 44, an extending wall 46, and an auxiliary portion 48. The side wall 44 has a first connection feature 50. In addition, the side wall 44 of the connecting board 36 is higher than a side wall 52 of the second rail 32 in order to correspond to height of the positioning members 42 of the carried object 24. The extending wall 46 is substantially bent from the side wall 44, and the auxiliary portion 48 can be protruded from the side wall 44 horizontally. Specifically, the mounting device 20 can be attached to the side wall 44 of the connecting board 36, and is adjacent to one of the mounting holes 40 of the connecting board 36. The mounting hole 40 can be in an U-shape, a J-shape, or other shapes, the present invention is not limited thereto. In the present embodiment, the mounting hole 40 can comprise a first portion 54 and a second portion 56. The first portion 54 is arranged on the extending wall 46, and the second portion 56 is arranged on the side wall 44 and communicating with the first portion 54.

As shown in FIG. 4 and FIG. 5, the mounting device 20 comprises a base portion 58, a blocking portion 60, and an operating portion 62.

The base portion 58 is arranged between the blocking portion 60 and the operating portion 62, and the base portion 58 is long plate shaped in the present embodiment. The base portion 58 comprises a first section 64a and a second section 64b corresponding to the first section 64a. The first section 64a can be attached to the first connection feature 50 of the connecting board 36 (such as through stamping). In the present embodiment, the first section 64a of the base portion 58 can comprise a second connection feature 66 corresponding to the first connection feature 50 of the connecting board 36, so that the mounting device 20 can be connected to the first connection feature 50 of the connecting board 36 through the second connection feature 66.

The blocking portion 60 is connected to the second section 64b of the base portion 58, and the blocking portion 60 is adjacent to the mounting hole 40 of the connecting board 36.

The operating portion 62 is operatively connected to the blocking portion 60 to control the blocking portion 60 to move. In the present embodiment, the operating portion 62 is elastic and is tilted to an appropriate height relative to the first section 64a of the base portion 58. Preferably, the mounting device 20 can further comprise an opening 68, at least one guiding portion 70, an extending portion 72, and at least one rib 74. The opening 68 is adjacent to the blocking portion 60, and the opening 68 corresponds to the mounting hole 40 of the connecting board 36. For example, the opening 68 can correspond to the second portion 56 of the mounting hole 40 of the connecting board 36. The at least one guiding portion 70 is adjacent to the blocking portion 60. In the present embodiment, the mounting device 20 comprises a pair of guiding portions 70, and each of the guiding portions 70 is adjacent to the corresponding blocking portion 60. The blocking portion 60 is arranged between the opening 68 and one of the guiding portions 70. The extending portion 72 can be arranged at an appropriate position on the mounting device 20. In the present embodiment, the extending portion 72 is arranged at a position away from the operating portion 62, but the present invention is not limited thereto. The extending portion 72 can correspond to the auxiliary portion 48 of the connecting board 36, for example, the auxiliary portion 48 of the connecting board 36 is configured to abut against the extending portion 72 of the mounting device 20, so that the mounting device 20 can be maintained at a predetermined position corresponding to the connecting board 36. The at least one rib 74 is arranged between the operating portion 62 and the blocking portion 60 for structural reinforcement, so that a junction between the operating portion 62 and the blocking portion 60 can have better structural strength. In the present embodiment, there are two ribs 74 arranged at corresponding positions, but the present invention is not limited thereto.

Figure 6A:
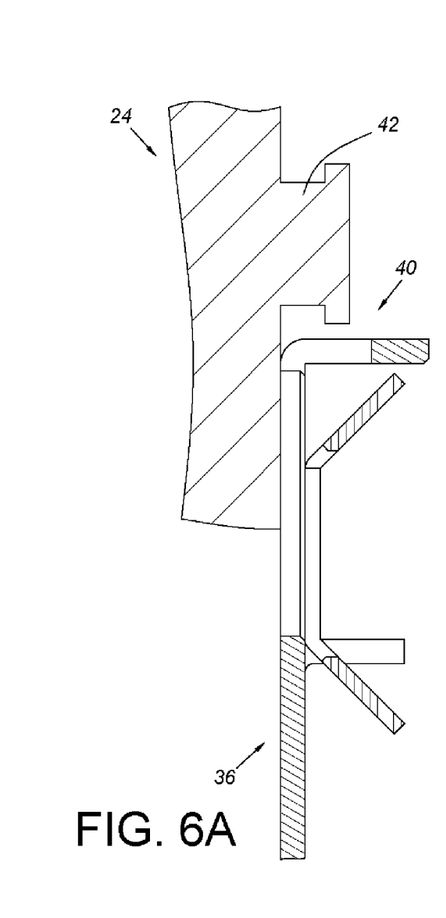
FIG. 6A is a diagram showing the carried object capable of being mounted to the mounting hole of the connecting board through a positioning member for illustrating the positioning member before entering the mounting hole according to an embodiment of the present invention.
Figures 6B, 6C:
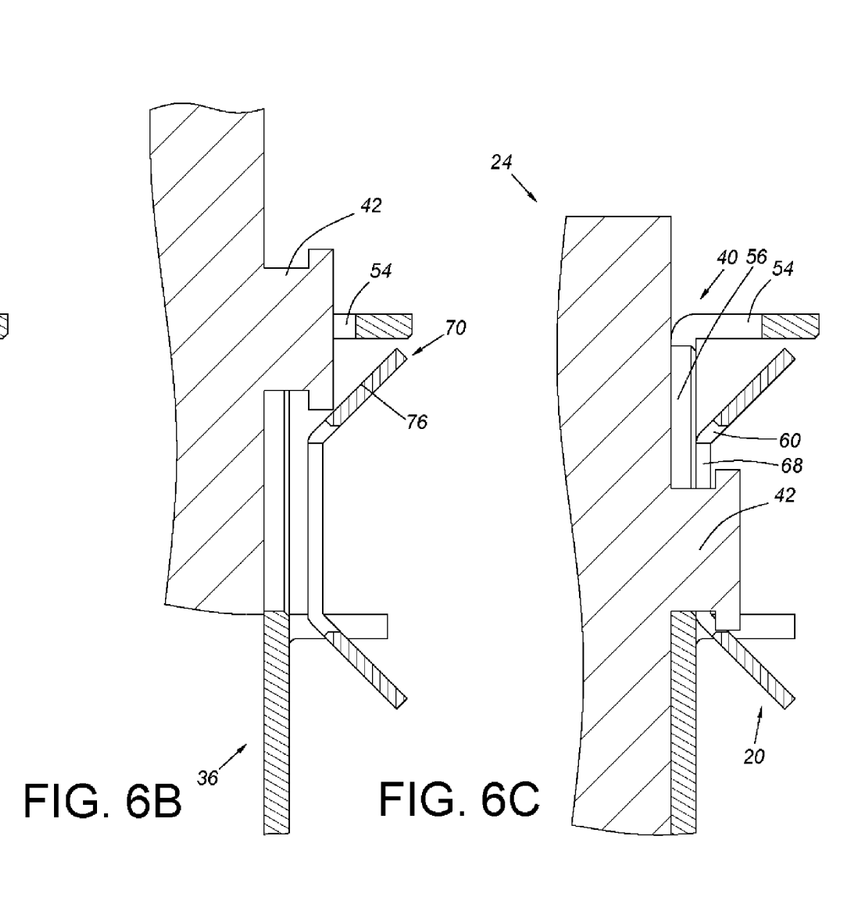
FIG. 6B is a diagram showing the carried object capable of being mounted to the mounting hole of the connecting board through the positioning member for illustrating the positioning member entering a first portion of the mounting hole, and a part of the positioning member being guided by a guiding portion of the mounting device according to an embodiment of the present invention.
FIG. 6C is a diagram showing the carried object capable of being mounted to the mounting hole of the connecting board through the positioning member for illustrating the positioning member entering a second portion of the mounting hole, and being blocked by a blocking portion of the mounting device according to an embodiment of the present invention.

As shown in FIG. 6A, FIG. 6B, and FIG. 6C, the carried object 24 can be correspondingly mounted to the mounting hole 40 of the connecting board 36 through the positioning member 42. Specifically, during a process of mounting the positioning member 42 of the carried object 24 to the mounting hole 40 of the connecting board 36, the positioning member 42 passes through the first portion 54 of the mounting hole 40, and a portion of the positioning member 42 is guided by an inclined plane 76 of the guiding portion 70 to enter the opening 68 of the mounting device 20 and is then blocked by the blocking portion 60, such that the positioning member 42 is restricted in the mounting hole 40 of the connecting board 36. For example, when the carried object 24 is lifted from the second portion 56 of the mounting hole 40 toward the first portion 54, the positioning member 42 is blocked by one of the blocking portions 60 of the mounting device 20.

Figure 7:
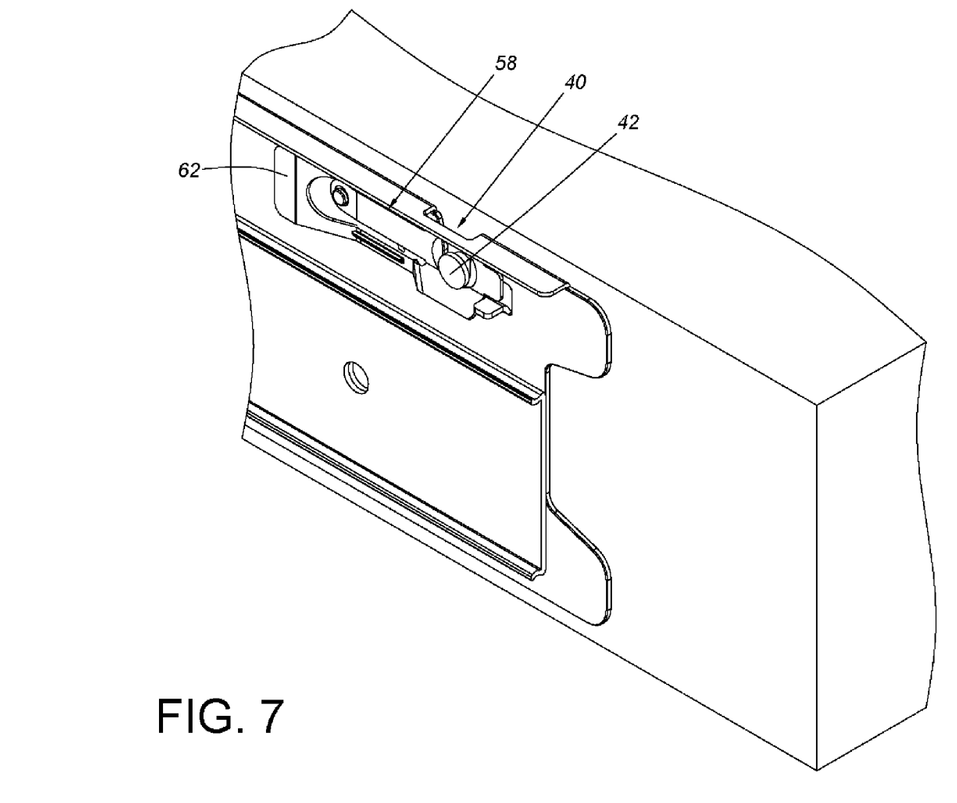
FIG. 7 is a diagram showing the positioning member of the carried object mounted to the mounting hole of the connecting board, and the positioning member blocked by the blocking portion of the mounting device according to an embodiment of the present invention.
Figure 8:
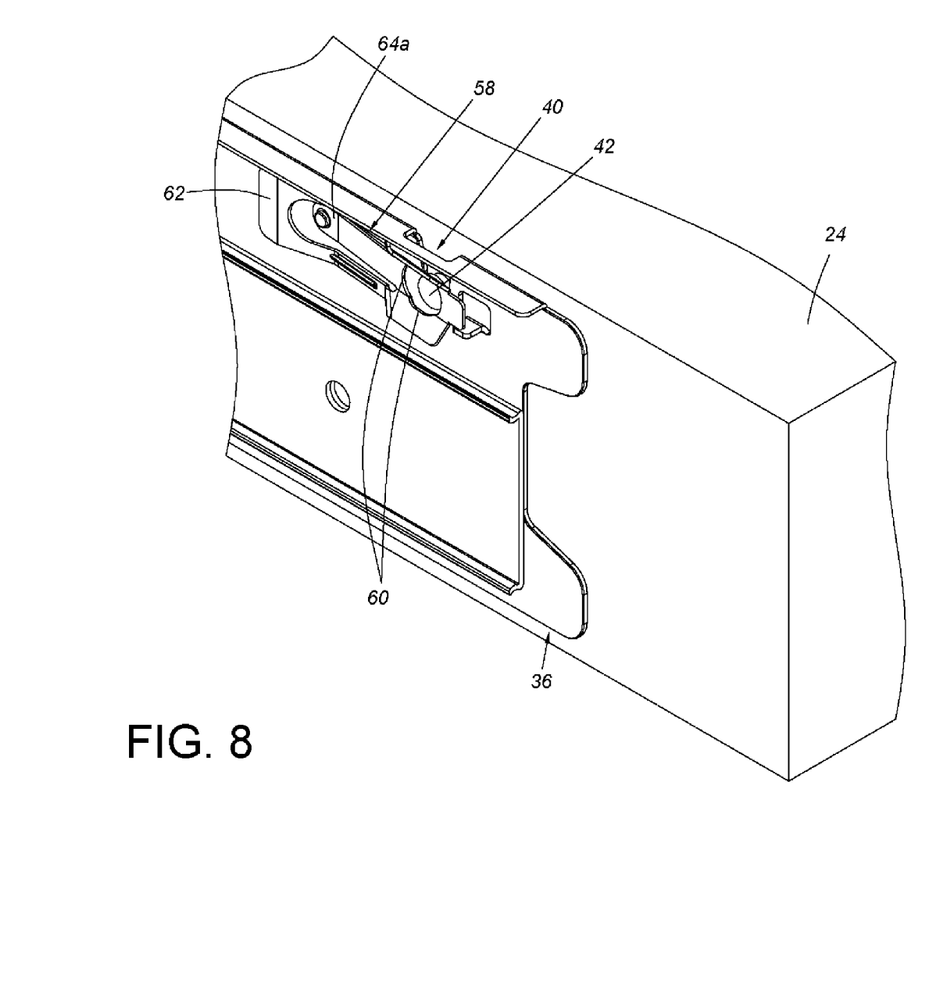
FIG. 8 is a diagram showing the positioning member of the carried object mounted to the mounting hole of the connecting board, and the positioning member able to be disengaged from the mounting hole of the connecting board by operating the operating portion of the mounting device according to an embodiment of the present invention.

As shown in FIG. 7 and FIG. 8, when the operating portion 62 is operated, the first section 64a of the base portion 58 is used as a fixed point to allow the blocking portion 60 to tilt toward a direction relative to the first section 64a of the base portion 58, so that the blocking portion 60 can be moved away from the mounting hole 40 of the connecting board 36, that is, the blocking portion 60 can be moved relative to the first section 64a of the base portion 58 to allow the positioning member 42 to avoid being blocked by the blocking portion 60. Therefore, the positioning member 42 can be disengaged from the mounting hole 40 of the connecting board 36 to remove the carried object 24 from the connecting board 36.

Figure 9:
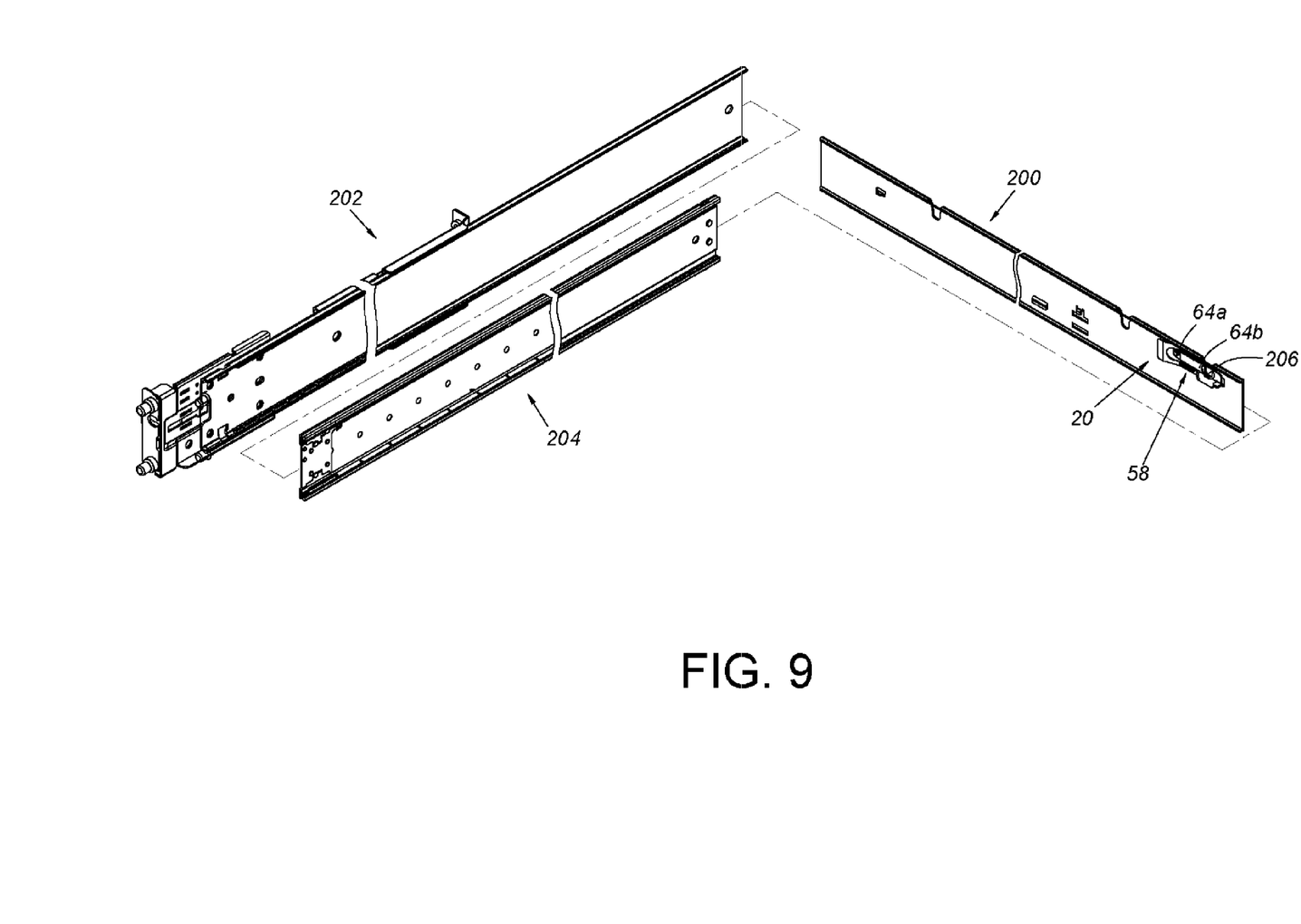
FIG. 9 is a diagram showing a mounting device attached to a rail of a slide rail assembly according to another embodiment of the present invention.

FIG. 9 shows the mounting device 20 according to a second embodiment of the present invention. The mounting device 20 can be directly attached to a rail of a slide rail assembly, such as a second rail 200. Specifically, the second rail 200 is longitudinally movable relative to a first rail 202. In the present embodiment, the second rail 200 is movably connected to the first rail 202 through a third rail 204, and is longitudinally movable relative to the first rail 202. However, in another embodiment of the present invention (not shown), the second rail 200 can be directly and movably connected to the first rail 202, and is longitudinally movable relative to the first rail 202, but the present invention is not limited thereto. The second rail 200 comprises at least one mounting hole 206 for mounting aforementioned positioning member of the carried object. The first section 64a of the mounting device 20 is connected to the second rail 200. The blocking portion (please refer to the blocking portion 60 in FIG. 5) of the mounting device 20 is connected to the second section 64b of the base portion 58, and is adjacent to a mounting hole 206 of the second rail 200. Detailed structural characteristics and operation principles related to the mounting device 20 can refer to the first embodiment (such as FIG. 4 and FIG. 5). By operating the operating portion 62 of the mounting device 20, the blocking portion 60 can be moved away from the mounting hole 206 of the second rail 200, such that the aforementioned positioning member of the carried object is able to disengage from the mounting hole 206 of the second rail 200. Further explanation is not provided for simplification.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mounting device, applicable to a slide rail assembly, the slide rail assembly being configured to mount a carried object to a rack, the slide rail assembly comprising a first rail and a second rail longitudinally movable relative to the first rail, the second rail being arranged with a mounting hole for mounting a positioning member of the carried object, the mounting device comprising:
   a base portion having a first section and a second section, the first section being connected to the second rail;
   a blocking portion connected to the second section of the base portion and adjacent to the mounting hole of the second rail, the blocking portion being configured to block the positioning member after the positioning member of the carried object enters into the mounting hole of the second rail;
   an operating portion tilted relative to the second rail and operatively connected to the blocking portion through the base portion, the operating portion configured to be pressed to move toward the second rail with the first section of the base portion being used as a fixed point, in order to tilt the blocking portion relative to the first section of the base portion to be away from the mounting hole of the second rail, so as to allow the positioning member to disengage from the mounting hole of the second rail; and
   an extending portion configured to abut against an auxiliary portion protruded from the second rail for maintaining the mounting device at a predetermined position.

2. The mounting device of claim 1 further comprising an opening adjacent to the blocking portion, the opening corresponding to the mounting hole of the second rail, wherein when the positioning member of the carried object is mounted to the mounting hole of the second rail, the positioning member enters the opening and is blocked by the blocking portion.

3. The mounting device of claim 1, wherein the base portion is arranged between the operating portion and the blocking portion, and the operating portion is tilted relative to the base portion.

4. The mounting device of claim 2 further comprising at least one guiding portion adjacent to the blocking portion, wherein the positioning member of the carried object is guided into the opening through the at least one guiding portion.

5. The mounting device of claim 1, wherein at least one rib is arranged between the operating portion and the blocking portion.

* * * * *